(12) United States Patent
Webb et al.

(10) Patent No.: US 10,446,710 B2
(45) Date of Patent: Oct. 15, 2019

(54) TRANSFER CHAMBER AND METHOD OF USING A TRANSFER CHAMBER

(71) Applicant: Varian Semiconductor Equipment Associates, Inc., Gloucester, MA (US)

(72) Inventors: Aaron P. Webb, Austin, TX (US); Charles T. Carlson, Cedar Park, TX (US); Paul Forderhase, Austin, TX (US); William T. Weaver, Austin, TX (US); Robert Brent Vopat, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 957 days.

(21) Appl. No.: 14/101,945

(22) Filed: Dec. 10, 2013

(65) Prior Publication Data

US 2014/0165908 A1    Jun. 19, 2014

Related U.S. Application Data

(60) Provisional application No. 61/736,723, filed on Dec. 13, 2012.

(51) Int. Cl.
*H01L 31/18* (2006.01)
*H01J 37/317* (2006.01)
(Continued)

(52) U.S. Cl.
CPC ............ *H01L 31/18* (2013.01); *H01J 37/185* (2013.01); *H01J 37/3171* (2013.01);
(Continued)

(58) Field of Classification Search
USPC ........................................................ 118/715
See application file for complete search history.

(56) References Cited

U.S. PATENT DOCUMENTS

| 5,980,187 A | * | 11/1999 | Verhovsky | ........ H01L 21/68707 294/103.1 |
| 2011/0027463 A1 | * | 2/2011 | Riordon | .................. H01J 37/20 427/75 |
| 2011/0159200 A1 | * | 6/2011 | Kogure | ................. C23C 14/042 427/458 |

FOREIGN PATENT DOCUMENTS

| JP | H04-272643 | * | 9/1992 |
| JP | H04-272643 A | | 9/1992 |

(Continued)

OTHER PUBLICATIONS

International Search Report and Written Opinion dated Mar. 25, 2014 for PCT/US2013/074462 filed Dec. 11, 2013.

*Primary Examiner* — Kambiz Zand
*Assistant Examiner* — Mirza Israr Javed

(57) ABSTRACT

An ion implanter and method for facilitating expeditious performance of maintenance on a component of the ion implanter in a manner that reduces downtime while increasing throughput of the ion implanter. The ion implanter includes a process chamber, a transfer chamber connected to the process chamber, a first isolation gate configured to controllably seal the transfer chamber from the process chamber, and a second isolation gate configured to controllably seal the transfer chamber from an atmospheric environment, wherein a component of the ion implanter can be transferred between the process chamber and the transfer chamber for performing maintenance on the component outside of the process chamber. Performing maintenance on a component of the ion implanter includes the steps of transferring the component from the process chamber to the transfer chamber, sealing the transfer chamber, venting the transfer chamber to atmospheric pressure, an opening the transfer chamber to an atmospheric environment.

3 Claims, 2 Drawing Sheets

(51) Int. Cl.
   *H01L 21/67* (2006.01)
   *H01J 37/18* (2006.01)
   *H01J 37/32* (2006.01)

(52) U.S. Cl.
   CPC .. *H01L 21/67155* (2013.01); *H01L 21/67173* (2013.01); *H01L 21/67184* (2013.01); *H01L 31/1804* (2013.01); *H01J 37/32412* (2013.01); *Y02E 10/547* (2013.01); *Y02P 70/521* (2015.11); *Y10T 29/49718* (2015.01)

(56) References Cited

FOREIGN PATENT DOCUMENTS

| | | | |
|---|---|---|---|
| JP | H05-47695 | * | 2/1993 |
| JP | H05-47695 A | | 2/1993 |
| WO | 2010/147997 A2 | | 12/2010 |

* cited by examiner

TRANSFER CHAMBER AND METHOD OF USING A TRANSFER CHAMBER

FIELD OF THE DISCLOSURE

The disclosure relates generally to the field of semiconductor processing, and more particularly to a system and method for efficiently transferring items into and out of a process chamber of an ion implanter.

BACKGROUND OF THE DISCLOSURE

Ion implantation is a technique for introducing conductivity-altering impurities into semiconductor workpieces. During ion implantation, a desired impurity material is ionized in an ion source chamber, the ions are accelerated to form an ion beam of prescribed energy, and the ion beam is focused and directed toward the surface of a workpiece positioned in a process chamber. The energetic ions in the ion beam penetrate into the bulk of the workpiece material and are embedded into the crystalline lattice of the material to form a region of desired conductivity.

Two concerns of the solar cell manufacturing industry are manufacturing throughput and cell efficiency. Cell efficiency measures the amount of energy converted into electricity. Higher cell efficiencies may be needed to stay competitive in the solar cell manufacturing industry. However, manufacturing throughput cannot be sacrificed at the expense of increased cell efficiency.

Ion implantation has been demonstrated as a viable method to dope solar cells. Use of ion implantation removes process steps needed for existing technology, such as diffusion furnaces. For example, a laser edge isolation step may be removed if ion implantation is used instead of furnace diffusion because ion implantation will only dope the desired surface. Besides removal of process steps, higher cell efficiencies have been demonstrated using ion implantation. Ion implantation also offers the ability to perform a blanket implant of an entire surface of a solar cell or a selective (or patterned) implant of only part of the solar cell. Selective implantation at high throughputs using ion implantation avoids the costly and time-consuming lithography or patterning steps used for furnace diffusion. Selective implantation also enables new solar cell designs. Any improvement to manufacturing throughput of an ion implanter or its reliability would be beneficial to solar cell manufacturers worldwide. This may accelerate the adoption of solar cells as an alternative energy source.

SUMMARY

In view of the foregoing, it would be advantageous to provide an ion implanter and a corresponding method for facilitating the expeditious performance of maintenance on components of the ion implanter in a manner that significantly reduces downtime of the ion implanter while increasing throughput.

An exemplary embodiment of an ion implanter in accordance with the present disclosure may include a process chamber, a transfer chamber connected to the process chamber, a first isolation gate configured to controllably seal the transfer chamber from the process chamber, and a second isolation gate configured to controllably seal the transfer chamber from an atmospheric environment, wherein a component of the ion implanter can be transferred between the process chamber and the transfer chamber for performing maintenance on the component outside of the process chamber.

An exemplary method for performing maintenance on an ion implanter in accordance with the present disclosure may include the steps of transferring a component of the ion implanter from a process chamber to a transfer chamber, the process chamber and the transfer chamber being at vacuum pressure, sealing the transfer chamber, venting the transfer chamber to atmospheric pressure while holding the process chamber at a vacuum pressure, and exposing the transfer chamber to an atmospheric environment. The process may further include performing maintenance on the component, sealing the transfer chamber, pumping the transfer chamber down to a vacuum pressure that is compatible with the interior of the process chamber, exposing the transfer chamber to the process chamber, and transferring the component from the transfer chamber back into the process chamber.

DETAILED DESCRIPTION

Figure 1:
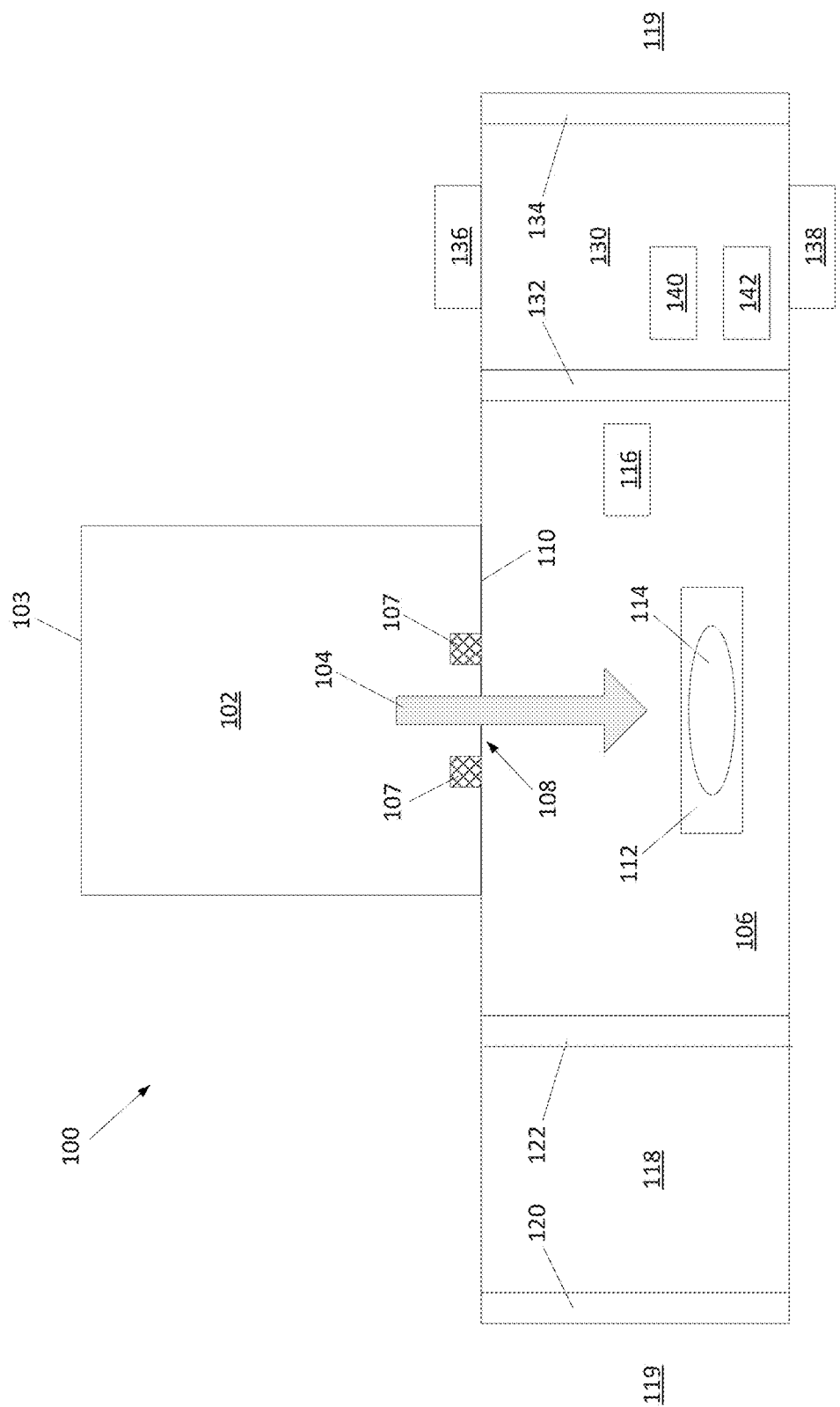
FIG. 1 is a schematic top view illustrating an exemplary ion implanter in accordance with the present disclosure.

A system and method in accordance with the present disclosure will now be described more fully hereinafter with reference to the accompanying drawings, in which preferred embodiments of the system and method are shown. The system and method, however, may be embodied in many different forms and should not be construed as being limited to the embodiments set forth herein. Rather, these embodiments are provided so that this disclosure will be thorough and complete, and will fully convey the scope of the system and method to those skilled in the art. In the drawings, like numbers refer to like elements throughout.

A transfer chamber for facilitating enhanced throughput of workpieces is described herein in connection with an ion implanter and an associated ion implantation process. However, it is not limited thereto, and it is contemplated that the transfer chamber of the present disclosure and methods of using the disclosed transfer chamber can be similarly implemented in a variety of other systems and processes, such as may be involved in the manufacture of solar cells or semiconductors, for example. Additionally, while the exemplary ion implanter disclosed herein is described in connection with the implantation of solar cells, it will be understood that such disclosure is provided for illustrative purposes only, and that the ion implanter can be similarly implemented for the implantation of other types of workpieces, including, but not limited to, semiconductor wafers, light emitting diodes (LEDs), silicon-on-insulator (SOI) wafers, and other such components.

FIG. 1 is a schematic top view of an exemplary an ion implanter 100 in accordance with an embodiment of the present disclosure. The ion implanter 100 may include an ion source 102 which, in one non-limiting example, may be a radio frequency (RF) plasma source that operates without mass analysis. Such a RF plasma source may use antennas to generate plasma from a working gas in a manner that will be familiar to those of ordinary skill in the art. It is contemplated that other types of ion sources, such as an indirectly heated cathode (IHC) ion source, may be similarly implemented in the ion implanter 100 without departing from the scope of the present disclosure.

The ion source 102 may be housed in a transfer chamber 103 that may be connected to a gas box (not shown) that supplies a working gas to the transfer chamber 103. The ion source 102 may generate an ion beam 104 from the working gas, and the ion beam 104 may be extracted into a process chamber 106 using extraction electrodes 107. An extraction aperture 108 may be formed in a wall 110 that separates the ion source 102 and the process chamber 106 for allowing the ion beam 104 to pass therebetween.

The ion beam 104 may be directed at a workpiece alignment mechanism 112 (hereinafter "the aligner 112") located in the process chamber 106. The aligner 112 may hold and/or align one or more workpieces 114 that are to be implanted. In one non-limiting example, the aligner 112 may be disposed on a platen (not shown), and the workpieces 114 may be solar cells. As shown in FIG. 1, the workpieces 114 may be located directly downstream of the extraction electrodes 107, and the ion beam 104 may be projected in a straight line from the ion source 102 toward the workpieces 114. Alternatively, it is contemplated that the ion beam 104 may be projected along a non-linear path from the ion source 102 to the workpieces 114, such as may be facilitated by the implementation of additional beam line components (e.g. electrodes, lenses, etc.) in the ion implanter 100.

In some embodiments the process chamber 106 may contain a scan robot or other workpiece transport system (not shown) for moving the workpieces 114 in a desired manner during implantation. The process chamber 106 may also be provided with a mask loader (not shown) configured to position a mask 116 in the path of the ion beam 104. For example, the mask 116 may be placed directly on the aligner 112. The mask 116 may be large enough to cover multiple workpieces 114 on the aligner 112 and may have apertures formed therein for defining regions to be implanted in each workpiece. Thus, the mask 116 may cover a selected portion of the workpiece 114 or workpieces and implantation of less than an entirety of a surface of each workpiece 114 may thereby be facilitated. In some embodiments the mask 116 may be fixed in the path of the ion beam 104 without engaging the aligner 112. In further embodiments, the mask 116 may moveable into and out of the path of the ion beam 104 without engaging the aligner 112. The mask 116 may be sized so that its overall dimensions are equal to or larger than the dimensions of the ion beam 104. Alternatively, the mask may be sized so that its overall dimensions are smaller than the dimensions of the ion beam 104. Apertures in the mask 116 may allow a portion or portions of the ion beam to pass therethrough so that specific regions of the workpiece or workpieces 114 are implanted. Thus, at least one of these specific regions can be sized to be smaller than the entire surface of a workpiece. If the mask 116 itself is smaller than the dimensions of the ion beam 104, then both a blanket implant and a selective implant of the workpieces 114 may occur. In this instance, the blanket and selective implants may be separate or at least partially simultaneous. In one particular embodiment, the mask 116 has dimensions large enough to cover multiple workpieces, which may be arranged in an array. The mask 116 may have multiple sets of apertures, each set corresponding to one of the multiple workpieces.

Referring again to FIG. 1, the process chamber 106 may be connected a load-lock 118 for allowing workpieces to be transferred between an atmospheric environment 119 outside of the process chamber 106 and a vacuum environment inside the process chamber 106. For example, an atmospheric robot (not shown) positioned outside the process chamber may move one or more workpieces into the load-lock 118, after which an isolation valve 120 of the load-lock 118 may be closed and the interior of the load-lock 118 evacuated to a vacuum level (100 millitorr, for example) compatible with the vacuum environment inside of the process chamber 106. After the load-lock 118 has been evacuated, an isolation valve 122 of the load-lock 118 may be opened, and a vacuum robot (not shown) positioned in the process chamber 106 may move the workpiece(s) from the load-lock 118 onto the aligner 112. In order to remove the workpiece(s) from the process chamber 106, such as after the workpiece(s) has been implanted, the above-described process may be reversed, with the load-lock 118 being vented to atmospheric pressure prior to removal of the workpiece(s) therefrom.

As described above, the aligner 112 and the mask 116 of the ion implanter 100 may be positioned in the process chamber 106. Both the aligner 112 and the mask 116 may need to be periodically cleaned, repaired, or replaced, such as during the performance of routine preventative maintenance (PM) of the ion implanter 100. In conventional ion implanters, PM is typically performed in the process chamber of the implanter, and requires the implanter to be shut down and the process chamber vented to atmospheric pressure. After PM is complete, the process chamber 106 is pumped back down to an adequate vacuum level before ion implantation operations can be resumed. It will be appreciated that performing PM on a traditional ion implanter significantly decreases uptime, throughput, and overall productivity of the ion implanter.

In order to reduce the downtime associated with performing PM, the ion implanter 100 of the present disclosure may be provided with a transfer chamber 130 connected to the process chamber 106. In the illustrated embodiment the transfer chamber 130 is positioned on a side of the process chamber 106 opposite that of the load lock 118, though this is not critical. The transfer chamber 130 may be provided with a first isolation gate 132 for controllably sealing the transfer chamber 130 from the process chamber 106, and a second isolation gate 134 for controllably sealing the transfer chamber 130 from the atmospheric environment 119. The transfer chamber 130 may be coupled to a vacuum pump 136 configured to controllably pump the transfer chamber 130 down to a vacuum level (100 millitorr, for example) commensurate with that of the process chamber 106, as will be further described below. The transfer chamber 130 may additionally be coupled to a gas source 138 configured to controllably vent the transfer chamber 130 to atmospheric pressure, as will be further described below.

The ion implanter 100 may be provided with a first transfer robot 140 configured to transfer the mask 116 between the process chamber 106 and the transfer chamber 130. The ion implanter 100 may further be provided with a second transfer robot 142 configured to transfer the aligner 112 between the process chamber 106 and the transfer chamber 130. It is contemplated that in some embodiments the ion implanter 100 may be provided with a single transfer robot (e.g., either the transfer robot 140 or the transfer robot 142) that is adapted to transfer both the mask 116 and the aligner 112 between the process chamber 106 and the transfer chamber 130. While the first and second transfer robots 140, 142 are shown in FIG. 1 as being disposed within the transfer chamber 130, it is contemplated that one or both of the first and second transfer robots 140, 142 may alternatively be disposed within the process chamber 106 or in an intermediate space (not shown) located between the process chamber 106 and the transfer chamber 130.

Prior to performing PM on the ion implanter 100, the first and second isolation gates 132, 134 of the transfer chamber 130 may be sealed and the interior of the transfer chamber 130 may be pumped down to a vacuum level compatible with the interior of the process chamber 106. The first isolation gate 132 may then be opened and one or both of the aligner 112 and the mask 116 may be moved from the process chamber 106 into the transfer chamber 130 by the first transfer robot 140 and/or the second transfer robot 142. The first isolation gate 132 may then be sealed and the interior of the transfer chamber 130 may be vented to atmospheric pressure using the gas source 138. The second isolation gate 134 may then be opened, making the interior of the transfer chamber 130 accessible from the atmospheric environment. The aligner 112 and/or the mask 116 may be removed from the transfer chamber 130 using one or both of the first and second transfer robots 140, 142. The aligner 112 and/or the mask 116 may then be cleaned, repaired, or replaced as desired. The above-described process may then be reversed, with the cleaned, repaired or replaced aligner 112 and/or mask 116 returned to the transfer chamber 130, and the second isolation gate 134 closed to seal the transfer chamber from atmosphere. The interior of the transfer chamber 130 can then be pumped down to vacuum level using the vacuum source 138. The first isolation gate 132 may then be opened and the aligner 112 and/or the mask 116 may be moved back into the process chamber 106 using one or both of the first and second transfer robots 140, 142. Operation of the ion implanter 100 can then be resumed.

As will be appreciated, implementing the transfer chamber 130 in the above-described manner thus allows PM of the aligner 112 and mask 116 to be performed without requiring the process chamber 106 to be vented to atmospheric pressure and subsequently pumped back down to vacuum prior to resuming operation. With the disclosed system and method only the transfer chamber 130 need be pumped and vented, which is far less time-consuming than pumping and venting the volume associated with the process chamber 106. A further advantage facilitated by the transfer chamber 130 is that a replacement aligner and/or replacement mask can be swapped into the process chamber 106 at the same time that the aligner 112 and/or mask 116 are removed from the process chamber 106 for maintenance, further reducing PM time. In such cases, operation of the ion implanter 100 may be nearly immediately resumed using the replacement component(s) without having to wait for PM of the aligner 112 and/or the mask 116 to be completed. The uptime and throughput of the ion implanter 100 are thereby significantly increased relative to traditional ion implanters.

Figure 2:
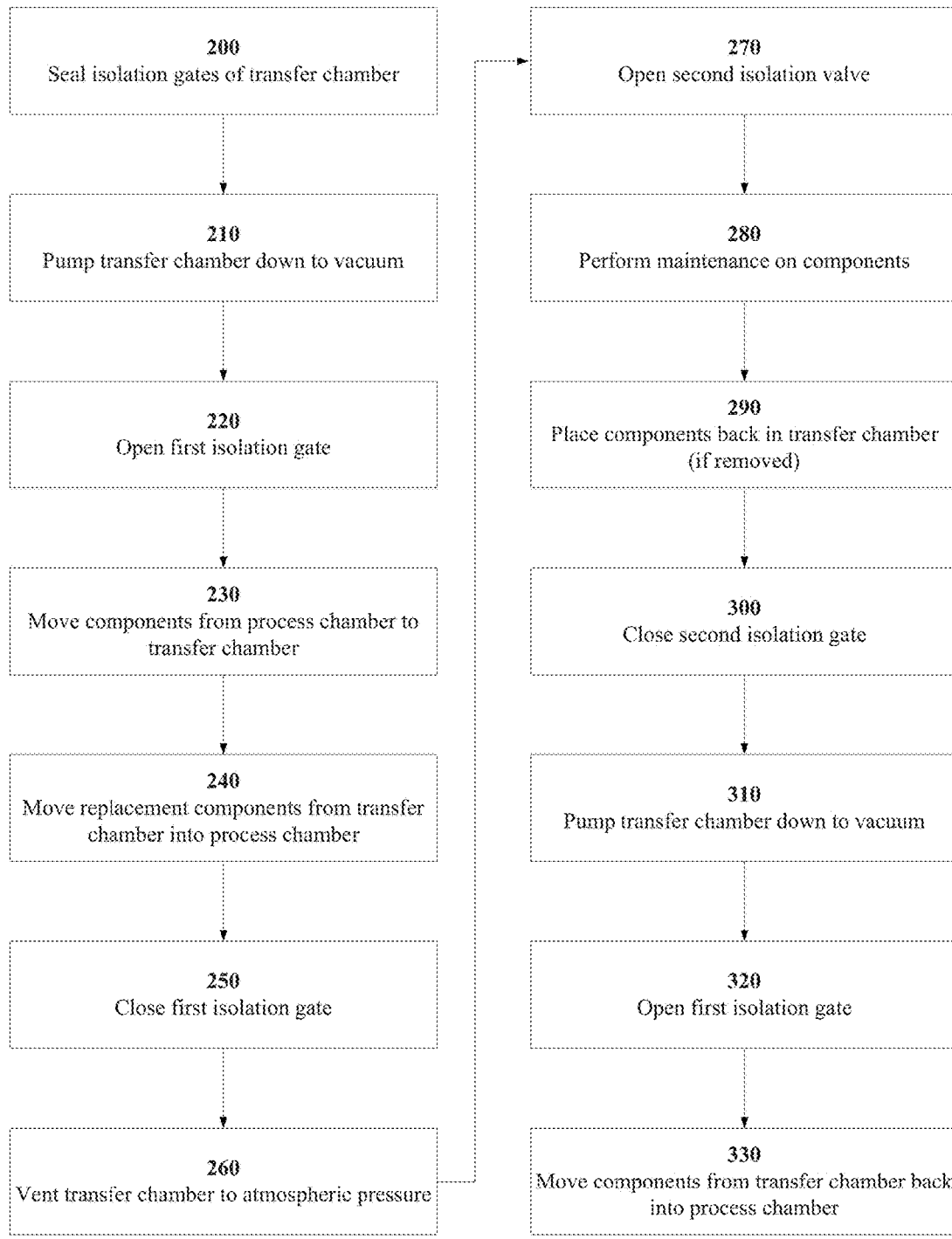
FIG. 2 is a flow diagram illustrating an exemplary method in accordance with the present disclosure for performing maintenance on the ion implanter shown in FIG. 1.

Referring now to FIG. 2, a flow diagram illustrating a method of operating the ion implanter 100 in accordance with the present disclosure is shown. The method will now be described with reference to the schematic view of the ion implanter 100 shown in FIG. 1.

At a first step 200, the first and second isolation gates 132, 134 of the transfer chamber 130 may be configured in a closed position, thereby sealing the transfer chamber 130 from the process chamber 106 and the atmospheric environment 119. The vacuum pump 136 may, at step 210, be activated to pump the interior of the transfer chamber 130 down to a vacuum level (100 millitorr, for example) compatible with the vacuum conditions of the process chamber 106.

At step 220, the first isolation gate 132 may be opened, exposing the interior of the transfer chamber 130 to the process chamber 106. At step 230, one or more components in need of maintenance, such as one or both of the aligner 112 and the mask 116, may be transferred from the process chamber 106 to the transfer chamber 130. Such transfer may be performed by one or both of the first and second transfer robots 140, 142. At optional step 240, one or more replacement parts, such as a replacement aligner 112 and/or a replacement mask 116, may be transferred from the transfer chamber 130 to the process chamber 106. Such transfer may also be performed by one or both of the first and second transfer robots 140, 142 and/or by one or more separate robots.

At step 250, the first isolation gate 132 may be closed, sealing the transfer chamber 130 from the process chamber 106. The gas source 138 may, at step 260, be activated to increase the pressure in the interior of the transfer chamber 130 to at or near atmospheric pressure. At step 270, the second isolation gate 132 may be opened, opening the transfer chamber 130 to the atmospheric environment 119.

At step 280, the components of the ion implanter 100 that were transferred to the transfer chamber in step 230 may be cleaned, repaired, or replaced as desired, such as may be required during the performance of routine PM. Cleaning and/or repair may be performed within the transfer chamber 130, or the components may be removed from the transfer chamber 130 for cleaning and/or repair.

After maintenance of the components is complete, the components may, at step 290, be placed back into the transfer chamber 130 (i.e., if they had previously been removed therefrom) and, at step 300, the second isolation gate 134 may be sealed. The vacuum pump 136 may then, at step 310, be activated to pump the interior of the transfer chamber 130 down to a vacuum pressure consistent with that of the process chamber 106.

At step 310, the first isolation gate 132 may be opened, opening the transfer chamber 130 to the process chamber 106. At step 320, the components may be transferred from the transfer chamber 130 back to the process chamber 106. Such transfer may be performed by one or both of the first and second transfer robots 140, 142.

Thus, it will be appreciated from the foregoing description that the ion implanter 100 and the corresponding method for implementing the transfer chamber 130 of the present disclosure facilitate the expeditious performance of maintenance, routine or otherwise, in a manner that significantly reduces downtime while increasing throughput of the ion implanter relative to traditional systems and methods.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A semiconductor manufacturing apparatus, comprising:
 a process chamber;
 a transfer chamber connected to the process chamber on a first side;
 an aligner installed within the process chamber for receiving and aligning workpieces;
 a first transfer robot disposed within the transfer chamber, the first transfer robot adapted to remove the aligner from the process chamber and to place the aligner in the transfer chamber to perform maintenance on the aligner outside of the process chamber;
 a second transfer robot disposed within the transfer chamber, the second transfer robot adapted to remove a mask from the process chamber and to place the mask in the transfer chamber to perform maintenance on the mask outside of the process chamber;
 a first isolation gate configured to controllably seal the transfer chamber from the process chamber;
 a second isolation gate configured to controllably seal the transfer chamber from an atmospheric environment;
 a load lock connected to the process chamber on a second side, the load lock separate from the transfer chamber; and
 a third transfer robot associated with the load lock, the third transfer robot adapted to transfer workpieces between the load lock and the process chamber.

2. The semiconductor manufacturing apparatus of claim 1, further comprising a vacuum pump connected to the transfer chamber, the vacuum pump configured to pump an interior of the transfer chamber to a predetermined vacuum pressure.

3. The semiconductor manufacturing apparatus of claim 1, further comprising a gas source connected to the transfer chamber and configured to increase the pressure of an interior of the transfer chamber to a predetermined value.

* * * * *